(12) United States Patent
deVilliers et al.

(10) Patent No.: US 10,734,229 B2
(45) Date of Patent: Aug. 4, 2020

(54) METHOD OF ADVANCED CONTACT HOLE PATTERING

(71) Applicant: Tokyo Electron Limited, Minato-ku, Tokyo (JP)

(72) Inventors: Anton J. deVilliers, Clifton Park, NY (US); Corey Lemley, Troy, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/240,310

(22) Filed: Jan. 4, 2019

(65) Prior Publication Data

US 2019/0214256 A1  Jul. 11, 2019

Related U.S. Application Data

(60) Provisional application No. 62/614,244, filed on Jan. 5, 2018.

(51) Int. Cl.
*H01L 21/033* (2006.01)
*H01L 21/3105* (2006.01)

(52) U.S. Cl.
CPC ...... *H01L 21/0338* (2013.01); *H01L 21/0337* (2013.01); *H01L 21/31053* (2013.01)

(58) Field of Classification Search
CPC .......... H01L 21/0338; H01L 21/31053; H01L 21/0337
See application file for complete search history.

*Primary Examiner* — Duy Vu N Deo
*Assistant Examiner* — Mahmoud Dahimene

(57) ABSTRACT

Techniques herein include a method of forming etch masks to form contact holes and other features. Techniques herein use a reversal method to create contact hole patterns with improved critical dimension uniformity and contact edge roughness as compared to traditional direct print photolithography methods. A pillar is printed as an initial structure. The initial structure is reshaped to change smoothness, uniformity, and/or dimensions. A conformal film is deposited on the pillar. The conformal film can include a metal-containing material. A planarization process is executed that removes pillars down to the working surface of the substrate leaving the conformal film on the working surface of the substrate. This conformal film can then be used as an etch mask for additional pattern transfer.

18 Claims, 5 Drawing Sheets

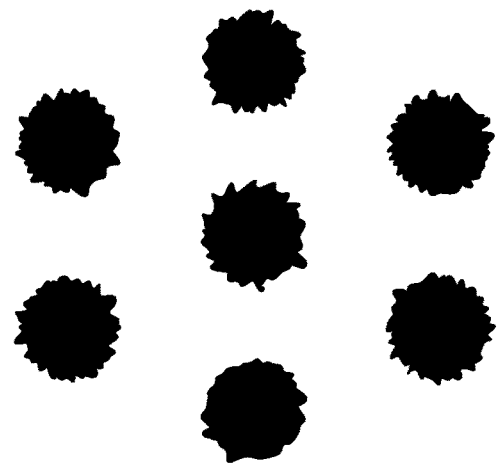
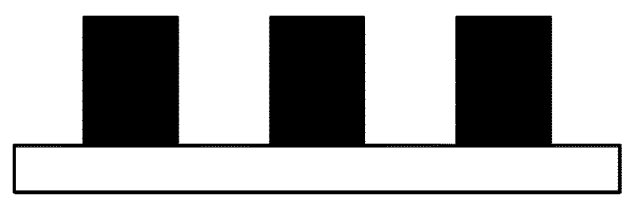
FIG. 7A
FIG. 7B
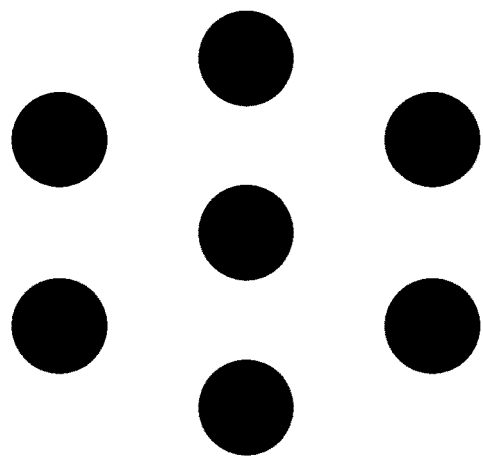
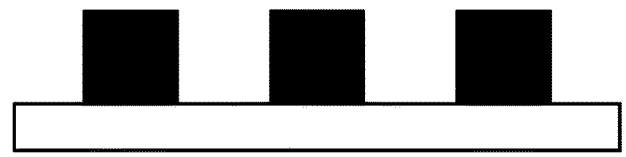
FIG. 8A
FIG. 8B

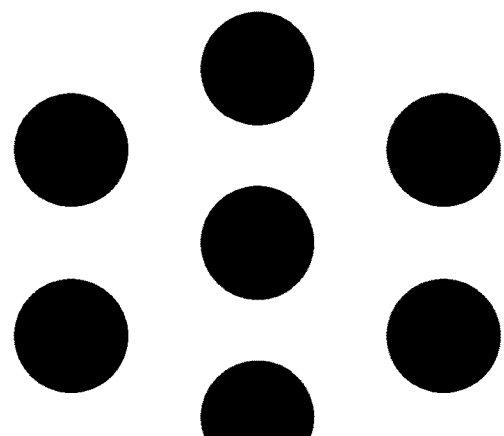
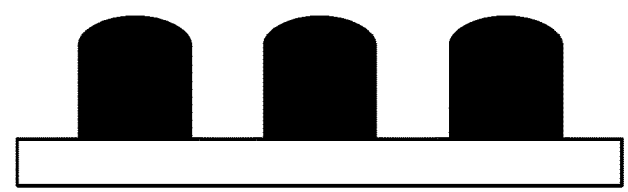
FIG. 9B
FIG. 9A
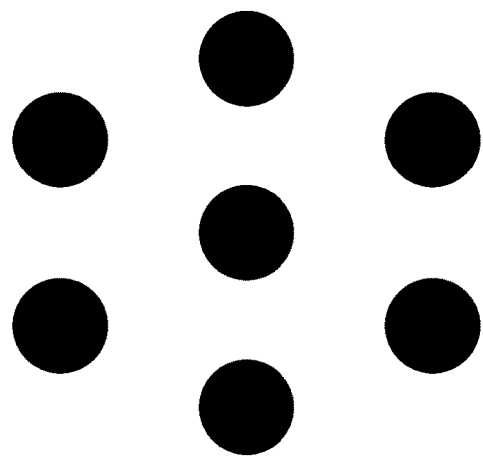
FIG. 10B
FIG. 10A

METHOD OF ADVANCED CONTACT HOLE PATTERNING

CROSS REFERENCE TO RELATED APPLICATIONS

The present application claims the benefit of U.S. Provisional Patent Application No. 62/614,244, filed on Jan. 5, 2018, entitled "Method of Advanced Contact Hole Patterning," which is incorporated herein by reference in its entirety.

BACKGROUND OF THE INVENTION

Techniques disclosed herein relate to microfabrication, and relate in particular to photolithography.

In material processing methodologies (such as photolithography), creating patterned layers typically involves the application of a thin layer of radiation-sensitive material, such as photoresist, to a surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithographic system. This exposure creates a latent pattern within the radiation-sensitive material which can then be developed. Developing refers to dissolving and removing a portion of the radiation-sensitive material to yield a topographic or physical pattern. For example, developing can include removal of irradiated regions of the radiation-sensitive material (as in the case of positive photoresist), or non-irradiated regions (as in the case of negative resist) using a developing solvent. The topographic pattern can then function as a mask layer for subsequent processing.

SUMMARY

In photolithography, printing of contact holes in a photoresist exhibits a decreased process window as feature pitch shrinks. This result is in part affected by a number or amount of photons that can pass through a mask—especially as a target pitch used is at the resolution limits of conventional photolithography systems. For example, in a 40 nm contact hole target critical dimension (CD) on an 80 nm pitch, contact holes are closed or malformed with increasingly high frequency across the wafer. This is undesirable because a single closed hole results in a 100% loss in yield in the final product die.

Local critical dimension uniformity (LCDU) is defined in a lithography step and is related inversely by the square root of the number of photons. Thus, as the number of photons increases, the pattern definition improves and a theoretically lower LCDU is attainable. Using more photons, however, means significantly longer processing time on a photolithography exposure tool (scanner, stepper) which means reduced throughput. With time spent on a photolithography tool being the largest portion of microfabrication cost, much effort is spent to reduce time on such tools.

Techniques herein include a method of forming contact holes. Techniques herein use a reversal method to create contact hole patterns with improved LCDU and CER (Contact Edge Roughness) as compared to traditional direct print photolithography methods. Instead of printing a hole, a pillar is printed as an initial structure. Printing (patterned actinic radiation exposure) pillars instead of holes enables using a same pitch as designed for a final hole, but with a larger scanner dose-bias. This allows printing the initial feature using more photons, which reduces stochastic effects contributed by a given photolithographic light source. With reversal techniques herein, the impact of LCDU and CER in the final printed hole can be reduced because the initial structure can use a larger maximum number photons to define the pattern.

One embodiment includes a method of forming a patterned mask having contact openings. This method includes forming a relief pattern of pillars (pillars structures) on a working surface of a substrate. The pillars protrude from the working surface of the substrate. A reshaping process is executed that modifies a shape of the pillars by rounding a profile of the pillars, or shrinking the pillars, and/or reducing roughness of the pillars. A first conformal film is deposited on the substrate, the first conformal film can include a hardmask material or metal-containing material. A planarization process is executed that removes pillars down to the working surface of the substrate leaving the first conformal film on the working surface of the substrate. This conformal film can then be used as an etch mask for pattern transfer.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIG. 7A is a top view of pillar structures according to embodiments disclosed herein.

FIG. 7B is a side view of pillar structures according to embodiments disclosed herein.

FIG. 8A is a top view of pillar structures according to embodiments disclosed herein.

FIG. 8B is a side view of pillar structures according to embodiments disclosed herein.

FIG. 9A is a top view of pillar structures according to embodiments disclosed herein.

FIG. 9B is a side view of pillar structures according to embodiments disclosed herein.

FIG. 10A is a top view of pillar structures according to embodiments disclosed herein.

FIG. 10B is a side view of pillar structures according to embodiments disclosed herein.

DETAILED DESCRIPTION

Techniques herein include methods for uniform and accurate patterning for microfabrication of various structures and features including contact holes. One technique includes printing and forming an initial size/shape pillar in a relief pattern, and then modifying that pillar and reversing the pattern as a method for generating an etch mask. For example, a larger dimension pillar structure, as compared to a target hole dimension desired, is printed in a layer of photoresist on a substrate, which can then be transferred to an underlying material (such as a carbon hardmask) to facilitate additional processing. Alternatively, the pillar formed of photoresist can be used/modified prior to transfer to an underlying layer. This printed pillar, having an initial size and shape, can then be modified. For example, the pillar can be resized and/or reshaped to a smaller dimension pillar or bump-shaped structure and/or a smoother pillar surface. Additional smoothing can be realized using an etch process, which has additional SiO2 content introduced to the structure during the etch process, as well as radical species exposure to induce further chemical cross-linking and densification of the polymer structure. The carbon pillar/bump can also be transferred into a layer of SiO2 or other film layer below the structure if the integration scheme requires the use of a higher temperature film to be coated on the top of the structure.

Following the pillar/bump formation, the substrate (including pillars and "floor" surface) is coated with a film of a low-temperature, highly-selective conformal material (hardmask material). Such a film can be formed using hafnium oxide, boron nitride, silicon nitride, aluminum oxide, titanium nitride, and other thin film materials that have high etch selectivity. After formation of a hardmask conformal film, the pillars along with their thin-shelled outer structure are mechanically planarized until the floor of the substrate (base of the pillars) is reached. Such planarization can be executed using Chemical Mechanical Planarization (CMP) or a planarizing etch process. In other words, the protruding bumps are ground away or ground down until reaching the base of the pillars. After the substrate is planarized, remaining pillar material (e.g. a carbon or oxide core) can be removed with a conventional etch, leaving behind a high fidelity contact hole which can then be transferred into one or more layers below.

Figure 1:
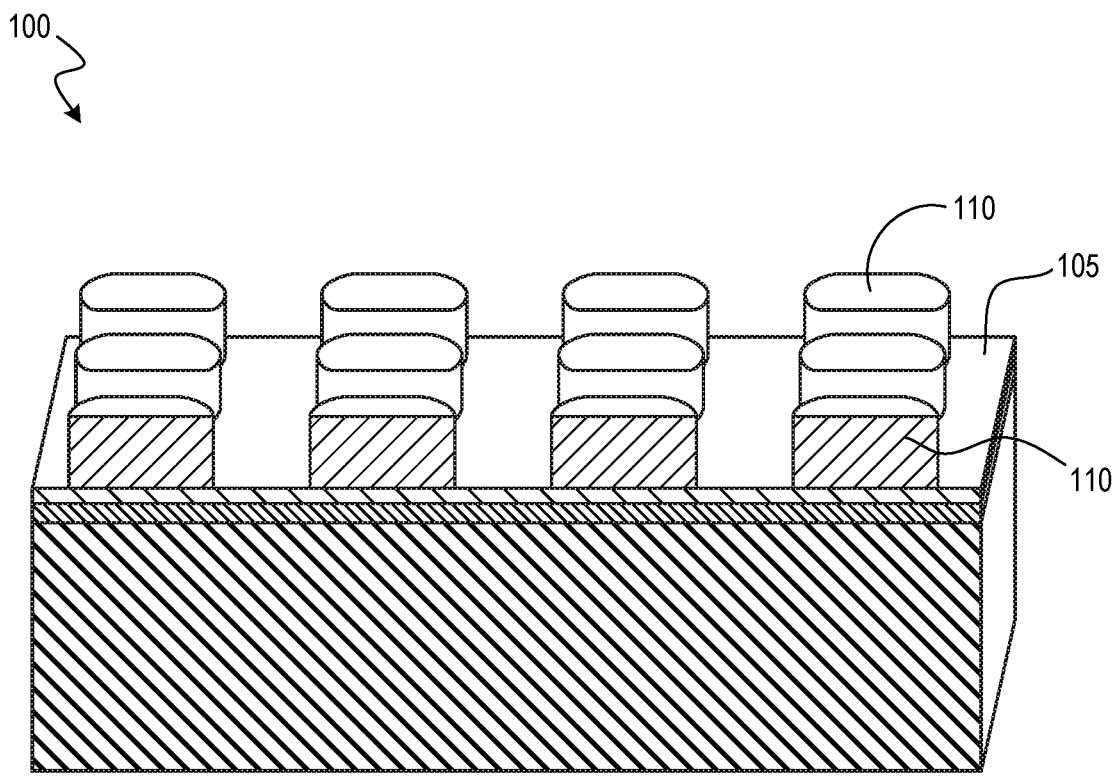
FIG. 1 is a cross-sectional perspective view of an example substrate segment showing a process flow according to embodiments disclosed herein.

One example embodiment includes a method of forming a patterned mask having contact openings. Referring now to FIG. 1, a relief pattern of pillars 110 or pillar structures is formed on a working surface 105 of a substrate 100. Such pillar structures can be cylindrical, square, hexagonal, rectangular, et cetera. The pillars can be in any array or spatial design. The pillars essentially protrude from the working surface or floor surface of the substrate. This relief pattern can be a layer of photoresist within which a pattern of light was exposed, or can be an underlying layer into which the relief pattern is transferred to have different material with different chemical and physical properties for subsequent processing. For example, certain photoresist materials can have thermal limitations for subsequent processing, and so a more temperature-resistant material can be used.

A reshaping process is then executed. This reshaping process modifies a shape of the pillars. Reshaping herein can include re-sizing and/or smoothing or other improvement. For example, such a modification process can include any of shrinking a width and height of the pillars, increasing a width or height of the pillars, reducing an edge (surface) roughness value of the pillars, and rounding a shape of the pillars or a top surface of the pillars. In some embodiments, reshaping can include modifying the cylinders into semi-spherical structures, which is essentially a bump shape.

Figure 2:
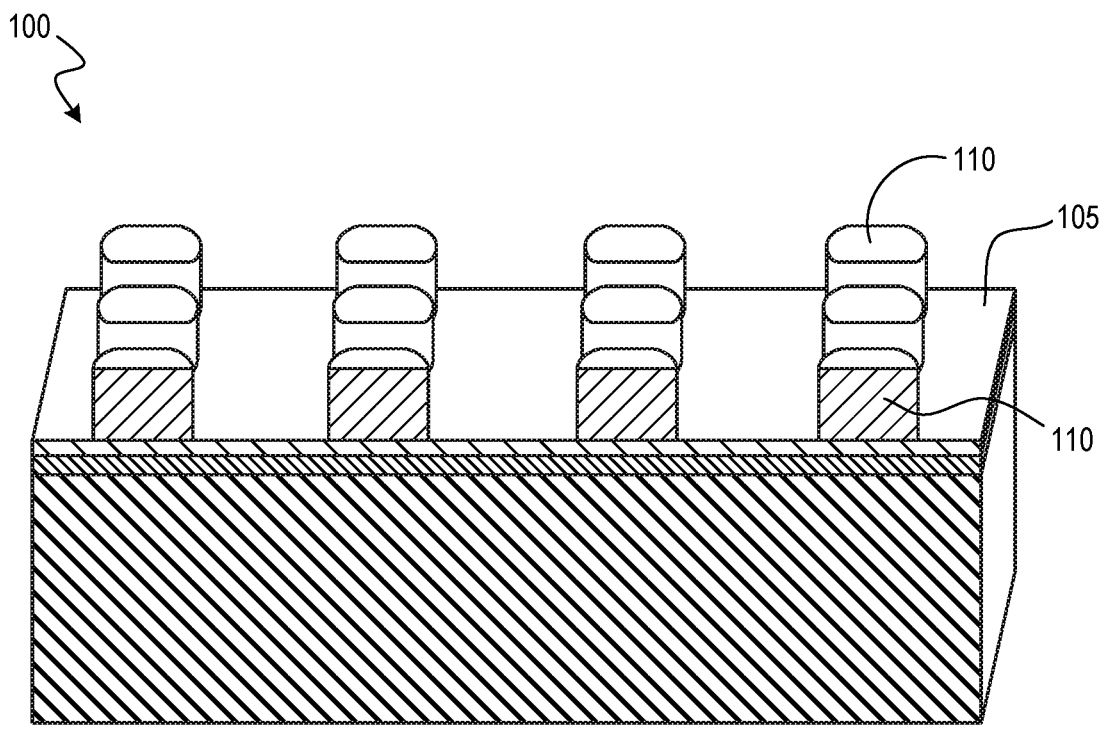
FIG. 2 is a cross-sectional perspective view of an example substrate segment showing reshaped pillar structures.

Such reshaping can improve fidelity of the structures themselves. In some embodiments this can include several etch and deposition step cycles because multiple depositions have a natural smoothing propensity. Another result is that hardening happens to the mandrel core from a combination of radical species penetrating through the surface of a polymer material increasing cross-linking density resulting in a more robust template structure. Other smoothing techniques, such as vapor smoothing can also be used. FIG. 2 illustrates an example result after a reshaping process that shrinks pillars. Note that this illustrates only one result of reshaping and one or more reshaping results can be executed on the pillars. For example, reshaping can include a smoothing operation as illustrated from FIG. 7A to FIG. 8A. In another example, reshaping can include a rounding operation that can be executed starting with pillars illustrated in FIG. 8B and ending with bump-shaped pillars illustrated in FIG. 10B. Alternatively, the result can be partial rounding and smoothing as illustrated in FIG. 9B. Accordingly, there are many reshaping operations available depending on a given microfabrication goal or design specification.

Individual reshaping process steps can be continued until resulting in an array of very smooth and uniform bumps—more uniform even than a photolithography pattern that formed the relief pattern initially. Techniques herein are more successful when modified pillars or bumps have approximately a 90 degree angle and no footing at a point of contact with the under layer material.

Figure 3:
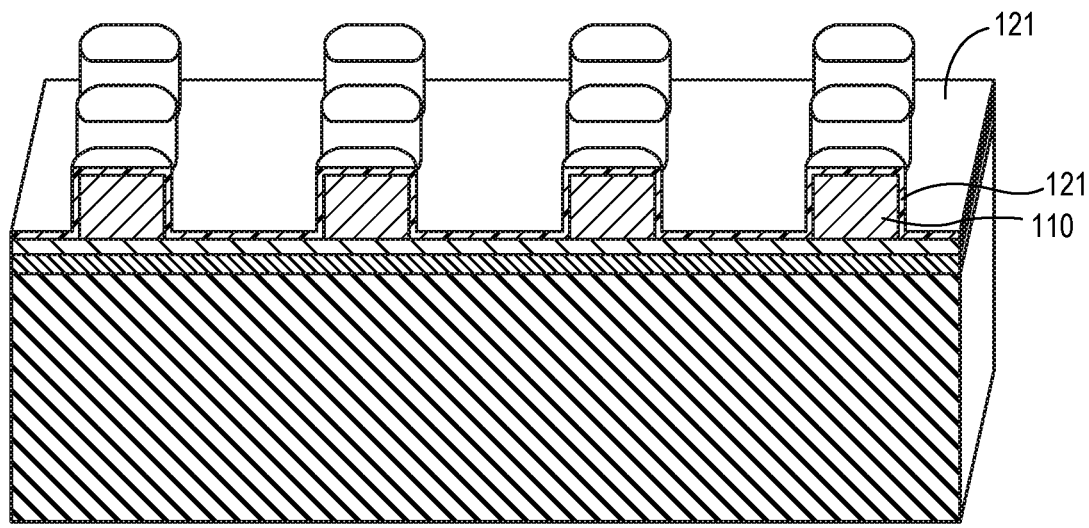
FIG. 3 is a cross-sectional perspective view of an example substrate segment showing conformally-coated pillar structures.

Referring now to FIG. 3, optionally, a first interfacial film 121 can be deposited on the substrate. The first interfacial film 121 can provide benefits for placement and removal of a hardmask conformal film. For example, for a subsequent metal-containing film, a higher thermal budget may be required than what is provided by the initial pillar material. The interfacial material can be selected to be removable via isotropic etching. An example film for use as the first interfacial film 121 is oxide. Such an interfacial film can be relatively thick or thin from individual nanometers to tens of nanometers. Such a deposition can be used to increase a width of pillar structures for subsequent transfer.

Figure 4:
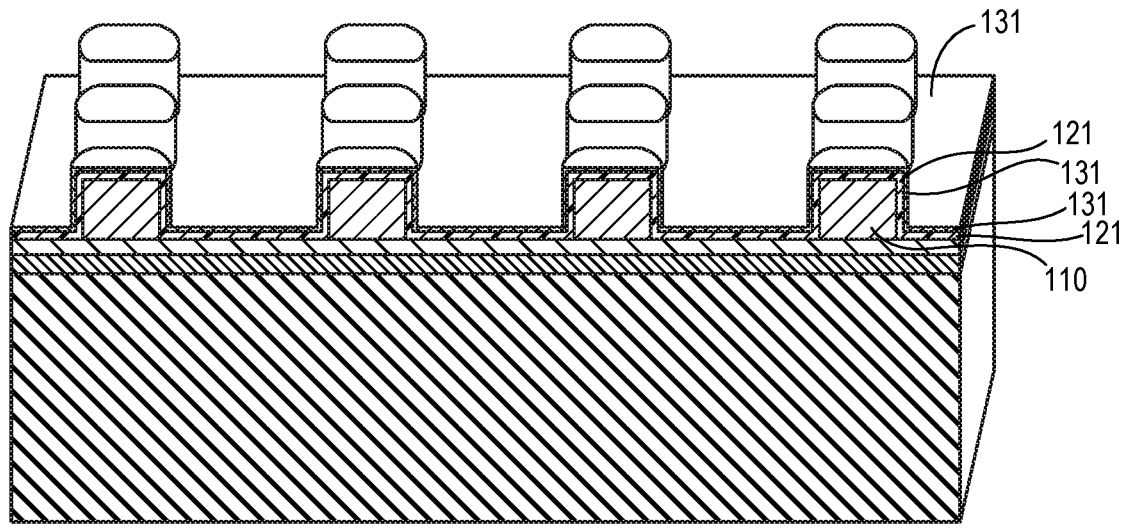
FIG. 4 is a cross-sectional perspective view of an example substrate segment showing conformally-coated pillar structures.

In FIG. 4, a first conformal film 131 is deposited on the substrate. For example, the first conformal film can be deposited on the pillar structures directly, or on the first interfacial film that was previously conformally deposited. The first conformal film covers uncovered surfaces of pillars and the working surface of substrate. This first conformal film comprises a hardmask material, metal-containing material, or other material with a very high etch resistivity as compared to underlying materials. Such etch resistivity can be greater than 100 to 1 as compared to the pillar material or underlying materials. The film is conformal in that the film deposits at a same thickness on all surfaces (pillar structures and floor or working surface) so whether the surface has a horizontal slope, vertical slope or angled or rounded slope the thickness is approximately the same. Using a metal film or metal-containing film is beneficial because such a film can be deposited by atomic layer deposition (ALD) and be very thin while providing high etch selectivity. Such a thin film provides an effective reversal effect.

The hardmask material of the conformal film can be selected from many options including, but not limited to, hafnium oxide, boron nitride, silicon nitride, aluminum oxide, titanium oxide, and titanium nitride. This is beneficial because such films can have high selectivity ratios. For example, with a hafnium oxide skin used as a mask for etching carbon, selectivity can be greater than 1000 to 1. This means a relatively thin skin or layer of hafnium can be used. Using a thin skin can also be beneficial for subsequent removal because some metal-containing films can cause problems (contamination) with patterning if not completely removed. Having an interfacial film can assist with such removal. For example, an oxide interfacial film can be fully removed with a vapor-phase etch, which means that the hafnium will also be fully removed. In some embodiments, film thicknesses can be less than 15 nanometers.

With pillars or bumps now covered with one or more conformal films, the pattern can be reversed. A planarization process is executed that removes pillars down to a top surface of the substrate leaving the first conformal film on the working surface of the substrate. This can be executed using a selective etch process or a chemical mechanical polishing (CMP) process. A CMP step can be executed until reaching the working surface of the substrate leaving the first conformal film on the working surface of the substrate. In other words, a CMP process is used to shave down or ground the coated bumps from the substrate while leaving the hardmask material on the floor of the substrate.

Figure 5:
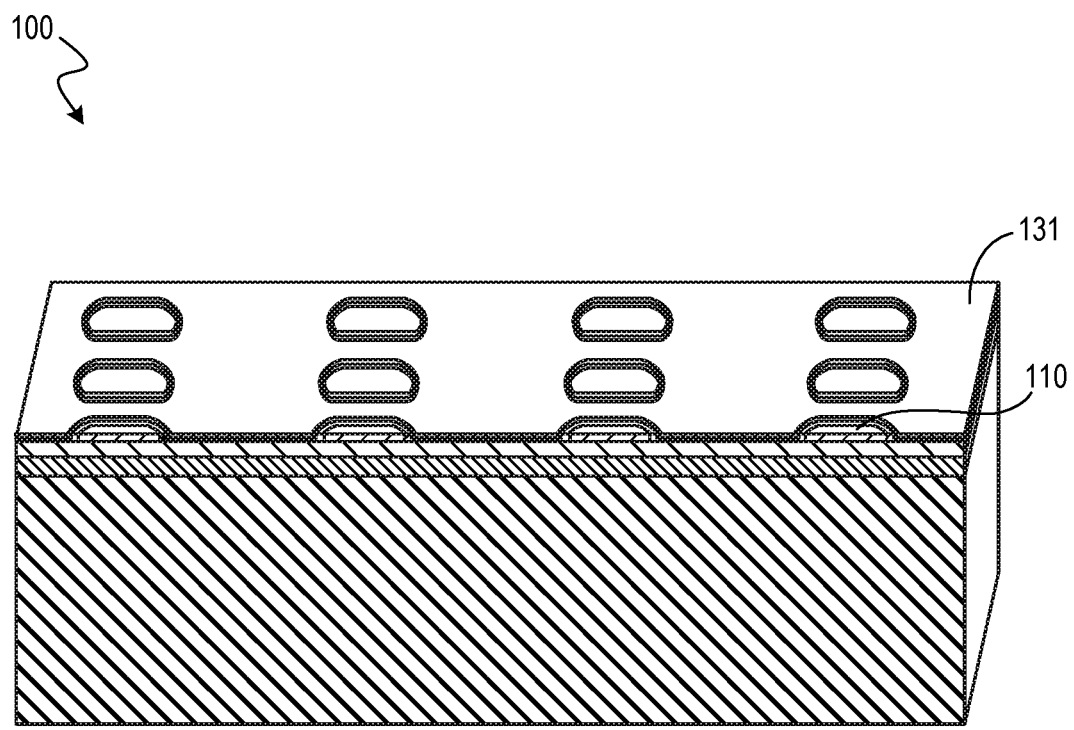
FIG. 5 is a cross-sectional perspective view of an example substrate segment showing planarization of the pillar structures.

A given CMP process can have an endpoint, for example, after detecting an increase of resistance or amount of material that a tool is seeing upon reaching the hardmask material on the working surface of the substrate. The bumps themselves can occupy a relatively small cross section of the substrate as the substrate is planarized. After removing the bumps and a CMP pad is flush with the working surface, there will be significantly more resistance and so a CMP process can be stopped. The significant increase in resistance provides a clear signal when to stop planarizing. In other words, the planarization steps essentially flush cuts the bumps/pillars from the substrate leaving the hardmask skin with a disc of pillar material or an underlying layer uncovered where pillars were removed. FIG. 5 illustrates an example result.

Figure 6:
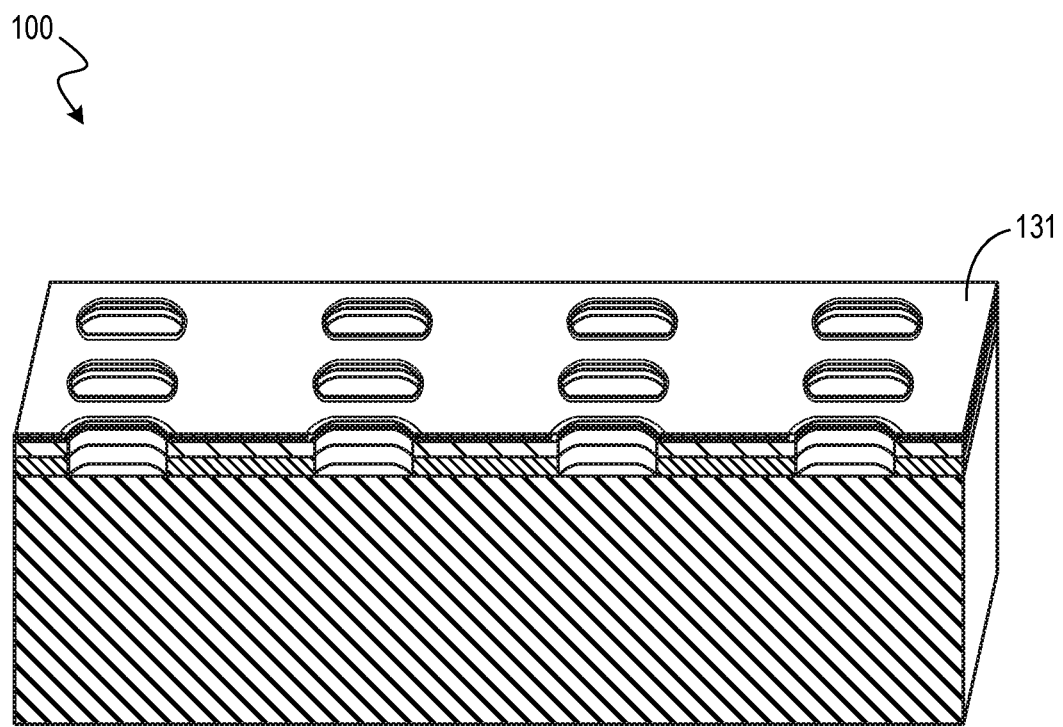
FIG. 6 is a cross-sectional perspective view of an example substrate segment showing etch pattern transfer.

The result is that the hardmask film now forms a patterned mask of contact openings. With hardmask material no longer covering the pillars/bumps, a directional (anisotropic) etch can be executed to transfer the contact pattern into one or more underlying layers. FIG. 6 illustrates an example result after transferring the pattern defined by the remaining first conformal film into underlying layers. The hardmask material and any interfacial film can then be removed for subsequent processing.

Another embodiment includes a method of forming a patterned mask having contact openings. A relief pattern of pillar structures is formed on a working surface of a substrate. The pillar structures extend normal to the working surface of the substrate. A reshaping process is executed that modifies a shape of the pillar structures resulting in a reduced roughness value of the pillar structures as compared to an initial roughness value. A first conformal film is deposited on the substrate that conformally coats the pillar structures and the working surface. The first conformal film comprises a metal-containing material. A planarization process is executed that mechanically (at least mechanically in addition to other removal mechanisms) removes pillar structures and the first conformal film covering the pillar structures down to the first conformal film covering the working surface of the substrate leaving the first conformal film on the working surface of the substrate. Remaining portions of the first conformal film are used as an etch mask to etch one or more underlying layers.

In yet another embodiment, a method of forming a patterned mask having contact openings is disclosed. A relief pattern of pillar structures is formed on a working surface of a substrate. The pillar structures extend normal to the working surface of the substrate. A reshaping process is executed that modifies a shape of the pillar structures resulting in increased local critical dimension uniformity as compared to a critical dimension uniformity value prior to the reshaping process. Subsequent to executing the reshaping process, a first interfacial film is deposited on the substrate that conformally coats the pillar structures and the working surface. Subsequent to depositing the first interfacial film, a first conformal film is deposited on the substrate that conformally coats the pillar structures and the working surface. The first conformal film comprises a metal-containing material having a thickness less than 15 nanometers. A planarization process is executed that mechanically removes pillar structures and the first conformal film covering the pillar structures down to the first conformal film covering the working surface of the substrate leaving the first conformal film on the working surface of the substrate. Mechanical removal can include chemical action. Remaining first conformal film or remaining portions of the first conformal film are used as an etch mask to etch one or more underlying layers.

Note that when an interfacial film—or multiple films—are used, there can be a ring or rings of material that result after the patterning process. Each conformal film deposited on the substrate is deposited on horizontal and vertical surfaces and will have a transition at the base of the pillar. With planarization occurring down to a top surface of the floor material (top surface of a last-deposited conformal film at the base of the pillars), any additional conformal films can be uncovered or revealed as rings within a contact opening (reversed pillar). In some embodiments, the last-deposited conformal film can be a desired mask to define a contact(s) and thus any additional conformal films or rings of material can be etched away. In other embodiments, the additional conformal films can be selected to provide etch resistivity and thus an inner diameter of an interfacial film or first-deposited conformal film can define a contact opening, which would be smaller than what is defined by a last-deposited conformal film. Thus a thickness of the interfacial or first-applied conformal film or an edge of a last-deposited (or only deposited) conformal film can control an edge roughness of each contact opening.

Results achieved are very smooth openings because conformal depositions can have a propensity to smooth. Another benefit is that a greater dose can be used in an exposure step for pillar formation compared to what is conventionally used or desired. Moreover, lower-resolution scanners and steppers can be used for the initial printing. Additionally, printing pillars instead of holes can result in a better signal-to-noise ratio. Techniques herein can be used with various technology nodes. By way of a non-limiting example, if a final target contact hole CD is 70 nm with 140 nm pitch, then the pillar can be shrunk from 80 nm or more down to a 70 nm dimension. For example, a starting height of a pillar can be around 80 nm and then be rounded and shrunk down to about 35-60 nm in height. Trimming herein can continue to about any final dimension. Accordingly, very small, uniform, and smooth contact holes can be patterned.

FIGS. 7-10 illustrate bump formation which has more reshaping of the initial structure (such as pillars) as compared reforming/reshaping just to reduce surface roughness. FIG. 7 illustrates a starting pattern of pillars. FIG. 7A is a top view, while FIG. 7B is a side view or profile view. Note that FIG. 7A illustrates that there is a measure of roughness to the sides of the pillars.

After printing the pillars or otherwise forming the pillars, a cyclical process of etch shrink and deposition growth can be executed, and/or separate surface smoothing techniques can also be executed. FIGS. 8A and 8B illustrate example results of an etch shrink process. Note that etch shrink can optionally be directional to primarily shrink a height of the pillars, or can be isotropic to uniformly shrink height and width.

Referring now to FIGS. 9A and 9B, after an etch shrink step, a deposition growth step can be executed in which material is deposited on the pillar. Such depositions can have a natural propensity for smoothing and rounding. Note in FIG. 9B that the pillars are starting to have a rounded shape. A given etch shrink step and deposition step can then be cycled, repeated several or many times until reaching a desired result.

FIGS. 10A and 10B illustrate an example result of such reshaping with etch and deposition cycling. Note that the pillars can be transformed into bumps which can appear to be approximately half of a sphere. In addition to the reduction in height, a width can be reduced. That is, an initial structure can be reduced in width as compared to a final structure. Thus, the resulting smaller structures can be beneficial for patterning contact openings among other things. It can be beneficial for bumps to have a perpendicular angle at the point of contacting the underlying layer to assist with reversal of the bumps after conformal deposition steps.

In another embodiment herein, pillars are formed but are not reshaped. In this embodiment, processing of such pillar structures comprises depositing a bottom-up filling of oxide, which thereby encapsulates the entire pillar and surrounding open areas. The substrate is then either planarized back to expose the pillars which are then exhumed by an etch step, or the overcoat is etched back to expose the pillars post processing which are then exhumed by a second etch step.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding.

Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of forming a patterned mask having contact openings, the method comprising:
    forming pillars on a working surface of a substrate, the pillars being part of a relief pattern of pillars, the pillars protruding from the working surface of the substrate;
    executing a reshaping process that modifies a shape of the pillars;
    depositing a first conformal film on the working surface of the substrate and on the pillars subsequent to executing the reshaping process, the first conformal film comprising hardmask material; and
    executing a planarization process that mechanically removes the pillars down to a top surface of the first conformal film covering the working surface of the substrate leaving the first conformal film on the working surface of the substrate.

2. The method of claim 1, wherein executing the reshaping process includes shrinking a width and height of the pillars.

3. The method of claim 1, wherein executing the reshaping process includes reducing an edge roughness value of a surface of each pillar.

4. The method of claim 1, wherein executing the reshaping process includes rounding a top surface of each pillar.

5. The method of claim 1, wherein executing the reshaping process includes removing material from the pillars resulting in the pillars having a semi-spherical shape.

6. The method of claim 1, wherein the first conformal film is deposited to result in a film thickness less than 15 nanometers.

7. The method of claim 6, wherein the first conformal film is selected to have an etch resistivity relative to a material of the pillars and a given etchant of greater than 100 to 1.

8. The method of claim 1, further comprising:
prior to depositing the first conformal film, conformally depositing a first interfacial film, wherein the first conformal film is deposited on the first interfacial film.

9. The method of claim 8, wherein the first interfacial film is removable via isotropic etching.

10. The method of claim 1, wherein the first conformal film covers uncovered surfaces of the pillars and the working surface of the substrate.

11. The method of claim 1, wherein the hardmask material of the first conformal film is selected from the group consisting of hafnium oxide, boron nitride, silicon nitride, aluminum oxide, titanium oxide, and titanium nitride.

12. The method of claim 1, wherein the hardmask material of the first conformal film is a metal-containing material.

13. The method of claim 1, wherein executing the reshaping process includes reducing a surface roughness value of the pillars.

14. The method of claim 1, wherein executing the reshaping process includes changing the pillars from a cylindrical shape to a bump shape.

15. The method of claim 1, wherein executing the planarization process includes executing a chemical mechanical polishing step until reaching the top surface of the first conformal film leaving the first conformal film on the working surface of the substrate.

16. A method of forming a patterned mask having contact openings, the method comprising:
forming a relief pattern of pillar structures, on a working surface of a substrate, with pillar structures extending normal to the working surface of the substrate;
executing a reshaping process that modifies a shape of the pillar structures resulting in a reduced roughness value of the pillar structures as compared to an initial roughness value;
depositing a first conformal film on the substrate that conformally coats the pillar structures and the working surface, the first conformal film comprising a metal-containing material;
executing a planarization process that mechanically removes the pillar structures and the first conformal film covering the pillar structures down to the first conformal film covering the working surface of the substrate leaving the first conformal film on the working surface of the substrate; and
using remaining portions of the first conformal film as an etch mask to etch one or more underlying layers.

17. The method of claim 16, wherein modifying the shape of the pillar structures includes shrinking a width of the pillar structures.

18. A method of forming a patterned mask having contact openings, the method comprising:
forming a relief pattern of pillar structures, on a working surface of a substrate, with pillar structures extending normal to the working surface of the substrate;
executing a reshaping process that modifies a shape of the pillar structures resulting in increased local critical dimension uniformity as compared to a critical dimension uniformity value prior to the reshaping process;
subsequent to executing the reshaping process, depositing a first interfacial film on the substrate that conformally coats the pillar structures and the working surface;
subsequent to depositing the first interfacial film, depositing a first conformal film on the substrate that conformally coats the pillar structures and the working surface, the first conformal film comprising a metal-containing material having a thickness less than 15 nanometers;
executing a planarization process that mechanically removes the pillar structures and the first conformal film covering the pillar structures down to the first conformal film covering the working surface of the substrate leaving the first conformal film on the working surface of the substrate; and
using remaining portions of the first conformal film as an etch mask to etch one or more underlying layers.

* * * * *